United States Patent
Haraguchi

(10) Patent No.: US 11,102,887 B2
(45) Date of Patent: Aug. 24, 2021

(54) ELECTRICAL CONNECTION DEVICE

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventor: Akira Haraguchi, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 16/957,265

(22) PCT Filed: Dec. 14, 2018

(86) PCT No.: PCT/JP2018/046118
§ 371 (c)(1),
(2) Date: Jun. 23, 2020

(87) PCT Pub. No.: WO2019/131222
PCT Pub. Date: Jul. 4, 2019

(65) Prior Publication Data
US 2020/0404790 A1 Dec. 24, 2020

(30) Foreign Application Priority Data
Dec. 28, 2017 (JP) .............................. JP2017-254840

(51) Int. Cl.
*H05K 1/18* (2006.01)
*H05K 7/06* (2006.01)
(Continued)

(52) U.S. Cl.
CPC ......... *H05K 1/186* (2013.01); *B60R 16/0238* (2013.01); *H02G 3/16* (2013.01);
(Continued)

(58) Field of Classification Search
CPC ...... H05K 1/186; H05K 1/0313; H05K 3/303; H05K 7/06; H01R 4/34; H01R 4/70;
(Continued)

(56) References Cited

U.S. PATENT DOCUMENTS

2010/0090328 A1* 4/2010 Goebl ..................... H01L 24/01
257/687
2012/0031656 A1 2/2012 Oka et al.
(Continued)

FOREIGN PATENT DOCUMENTS

JP H9-321395 A 12/1997
JP 2003-164040 A 6/2003
(Continued)

OTHER PUBLICATIONS

International Search Report, Application No. PCT/JP2018/046118, dated Feb. 5, 2019. ISA/Japan Patent Office.

*Primary Examiner* — Xiaoliang Chen
(74) *Attorney, Agent, or Firm* — Honigman LLP

(57) ABSTRACT

An electrical connection device includes a first conductive plate provided with a cutout in a circumferential edge portion of the first conductive plate and a second conductive plate adjacent to the first conductive plate without contacting the first conductive plate. A switching element includes a first terminal connected to the first conductive plate, a second terminal connected to the second conductive plate, and a control terminal, and that is turned on or off according to a voltage of the control terminal, wherein the electrical connection device further includes an insulator embedded in the cutout. A conductive path is provided on the surface of (Continued)

the insulator and that does not contact the first conductive plate, and to which the control terminal is connected.

8 Claims, 13 Drawing Sheets

(51) Int. Cl.

| | |
|---|---|
| *H01R 4/34* | (2006.01) |
| *H01R 4/70* | (2006.01) |
| *H01R 9/22* | (2006.01) |
| *H01R 11/12* | (2006.01) |
| *H01R 13/447* | (2006.01) |
| *H01R 25/14* | (2006.01) |
| *H01R 25/16* | (2006.01) |
| *H01L 21/54* | (2006.01) |
| *H01L 23/16* | (2006.01) |
| *B60R 16/023* | (2006.01) |
| *H02G 3/16* | (2006.01) |
| *H05K 1/03* | (2006.01) |
| *H05K 3/30* | (2006.01) |

(52) U.S. Cl.
CPC ............ *H05K 1/0313* (2013.01); *H05K 3/303* (2013.01); *H05K 7/06* (2013.01); *H05K 2201/10166* (2013.01)

(58) Field of Classification Search
CPC ........... H01R 9/22; H01R 9/223; H01R 11/12; H01R 13/447; H01R 25/14; H01R 25/16; H01R 25/62; H01L 21/54; H01L 23/16
USPC .......... 174/260; 257/687, E21.501, E23.135, 257/E23.14, E23.173; 439/207; 136/244
See application file for complete search history.

(56) References Cited

U.S. PATENT DOCUMENTS

2017/0318668 A1   11/2017  Yosui
2018/0205160 A1*  7/2018  Boisnier ............... H01R 25/162
2019/0045635 A1*  2/2019  Chin ....................... H02G 3/03

FOREIGN PATENT DOCUMENTS

| | | |
|---|---|---|
| JP | 2016-134366 A | 7/2016 |
| JP | 2016-160528 A | 9/2016 |

\* cited by examiner

ELECTRICAL CONNECTION DEVICE

CROSS-REFERENCE TO RELATED APPLICATIONS

This application is the U.S. national stage of PCT/JP2018/046118 filed on Dec. 14, 2018, which claims priority of Japanese Patent Application No. JP 2017-254840 filed on Dec. 28, 2017, the contents of which are incorporated herein.

TECHNICAL FIELD

The present disclosure relates to an electrical connection device.

BACKGROUND

Vehicles are equipped with an electrical junction box connected to a power source and a load such as a headlamp or a wiper. The electrical junction box electrically connects the power source and the load, and interrupts this connection (see JP 2003-164040A).

In the electrical junction box disclosed in JP 2003-164040A, a source terminal and a drain terminal of a FET (switching element) are connected to two bus bars (conductive plates). The source terminal of the FET is connected to the power source (or the load) via one of the two bus bars, and the drain terminal of the FET is connected to the load (or the power source) via the other of the two bus bars.

A circuit board on which a control element is mounted is placed on the two bus bars. When the control element outputs a control signal, the on/off state of the FET is switched. If the FET is turned on, the two bus bars are electrically connected to each other. As a result, a current flows through the FET, and power is supplied from the power source to the load. If the FET is turned off, the two bus bars are electrically isolated from each other. As a result, the current flowing through the FET is cut off, and the power supply from the power source to the load is stopped.

The electronic component disclosed in JP H9-321395A is provided with a main body of the electronic component and three terminals provided on the main body. The three terminals are connected to three bus bars. The main body has a plurality of outer surfaces, and the first terminal and the second terminal of the three terminals are respectively provided on different outer surfaces. The third terminal of the three terminals is provided on the outer surface on which the first terminal is provided to be adjacent to the first terminal. If the electronic component disclosed in JP H9-321395A is a FET, the first to third terminals are a source terminal, a drain terminal, and a gate terminal. The gate terminal is connected to the control element of the circuit board via the bus bar.

In recent years, FETs have been miniaturized. By employing a small FET, the size of an electrical junction box can be reduced.

With the miniaturization of FETs, the separation distance between the source terminal and the gate terminal has been reduced. However, if the separation distance between the source terminal and the gate terminal is short, it may be difficult to ensure that the bus bar to be connected to the source terminal and the bus bar to be connected to the gate terminal do not contact each other. In this case, a small FET cannot be used, and the size of the electrical junction box cannot be reduced.

Therefore, an object is to provide an electrical connection device that can be reduced in size.

An electrical connection device according to one embodiment is an electrical connection device including: a first conductive plate provided with a cutout in a circumferential edge portion of the first conductive plate; a second conductive plate adjacent to the first conductive plate without contacting the first conductive plate; a switching element that includes a first terminal connected to the first conductive plate, a second terminal connected to the second conductive plate, and a control terminal, and that is turned on or off according to a voltage of the control terminal, wherein the electrical connection device further includes an insulator embedded in the cutout, and a conductive path that is provided on the surface of the insulator and that does not contact the first conductive plate, and to which the control terminal is connected.

Effects of the Present Disclosure

According to the above, it is possible to provide an electrical connection device that can be reduced in size.

DETAILED DESCRIPTION OF PREFERRED EMBODIMENTS

Figure 1:
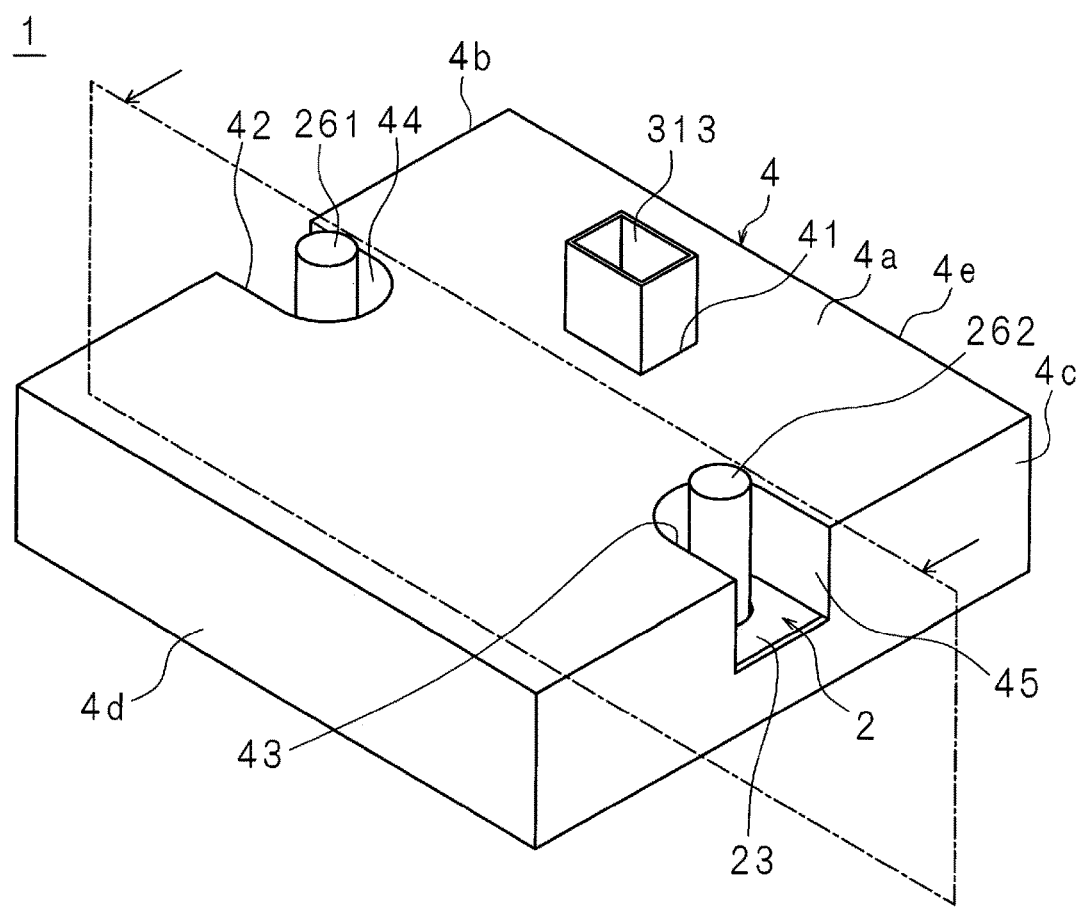
FIG. 1 is a perspective view of an electrical junction box provided with an electrical connection device according to an embodiment.

First, embodiments of the present disclosure will be listed and described. Further, at least some of the embodiments described below may be optionally combined.

The electrical connection device according to one embodiment is an electrical connection device including: a first conductive plate provided with a cutout in a circumferential edge portion of the first conductive plate; a second conductive plate adjacent to the first conductive plate without contacting the first conductive plate; a switching element that includes a first terminal connected to the first conductive plate, a second terminal connected to the second conductive plate, and a control terminal, and that is turned on or off according to a voltage of the control terminal, wherein the electrical connection device further includes an insulator embedded in the cutout, and a conductive path that is provided on the surface of the insulator and that does not contact the first conductive plate, and to which the control terminal is connected.

In this embodiment, a cutout is provided in the circumferential edge portion of the first conductive plate, and an insulator is embedded in the cutout of the first conductive plate. A conductive path is provided on the surface of the insulator.

The first terminal of the switching element is connected to the first conductive plate. The second terminal of the switching element is connected to the second conductive plate. The control terminal of the switching element is connected to the conductive path.

It is easy to prevent contact between the first conductive plate and the conductive path provided on the surface of the insulator. Accordingly, even if the separation distance between the first terminal and the control terminal of the switching element is short, the first conductive plate and the conductive path can be insulated from each other.

Therefore, a small switching element having terminals arranged close to each other can be used as a switching element constituting the electrical connection device. As a result, the size of the electrical connection device can be reduced.

In the electrical connection device according to this embodiment, the insulator preferably contains metal particles.

In this embodiment, an insulator containing metal particles is embedded in the cutout of the first conductive plate.

A conductive path can be provided on the surface of the insulator, for example, by irradiating the insulator containing metal particles with laser light to convert the metal particles into a conductor and plating the conductor. Also, a conductive path can be provided by printing and sintering a metal nanoparticle paste on the surface of a general-purpose insulator.

In the electrical connection device according to this embodiment, the first conductive plate and the second conductive plate are preferably integrated by a synthetic resin having insulating properties, and the synthetic resin, which is provided between the first conductive plate and the second conductive plate, and the switching element preferably face each other across a gap.

In this embodiment, between the first conductive plate and the second conductive plate, a gap is formed between the synthetic resin, which integrates the first conductive plate and the second conductive plate, and the switching element. Accordingly, for example, if the switching element generates heat, the synthetic resin can thermally expand toward the gap. That is to say, the gap functions as a clearance for the synthetic resin.

The electrical connection device according to this embodiment preferably further includes: a third conductive plate adjacent to the first conductive plate without contacting the first conductive plate; and a second switching element that includes a third terminal connected to the first conductive plate, a fourth terminal connected to the third conductive plate, and a second control terminal connected to the conductive path, and that is turned on or off according to a voltage of the second control terminal.

In this embodiment, the third terminal of the second switching element is connected to the first conductive plate. The fourth terminal of the second switching element is connected to the third conductive plate. The second control terminal of the second switching element is connected to the conductive path.

It is easy to prevent contact between the first conductive plate and the conductive path provided on the surface of the insulator. Accordingly, even if the separation distance between the third terminal and the second control terminal of the second switching element is short, the first conductive plate and the conductive path can be insulated.

Therefore, a small switching element having terminals arranged close to each other can be used as a switching element constituting the electrical connection device. As a result, the size of the electrical connection device can be reduced.

Specific examples of the electrical connection device according to an embodiment will be described below with reference to the drawings. Note, that the present disclosure is not limited to these exemplifications, but is indicated by the claims, and is intended to include all modifications within the meaning and the scope equivalent to the claims.

FIG. 1 is a perspective view of an electrical junction box provided with an electrical connection device according to the embodiment.

Figure 2:
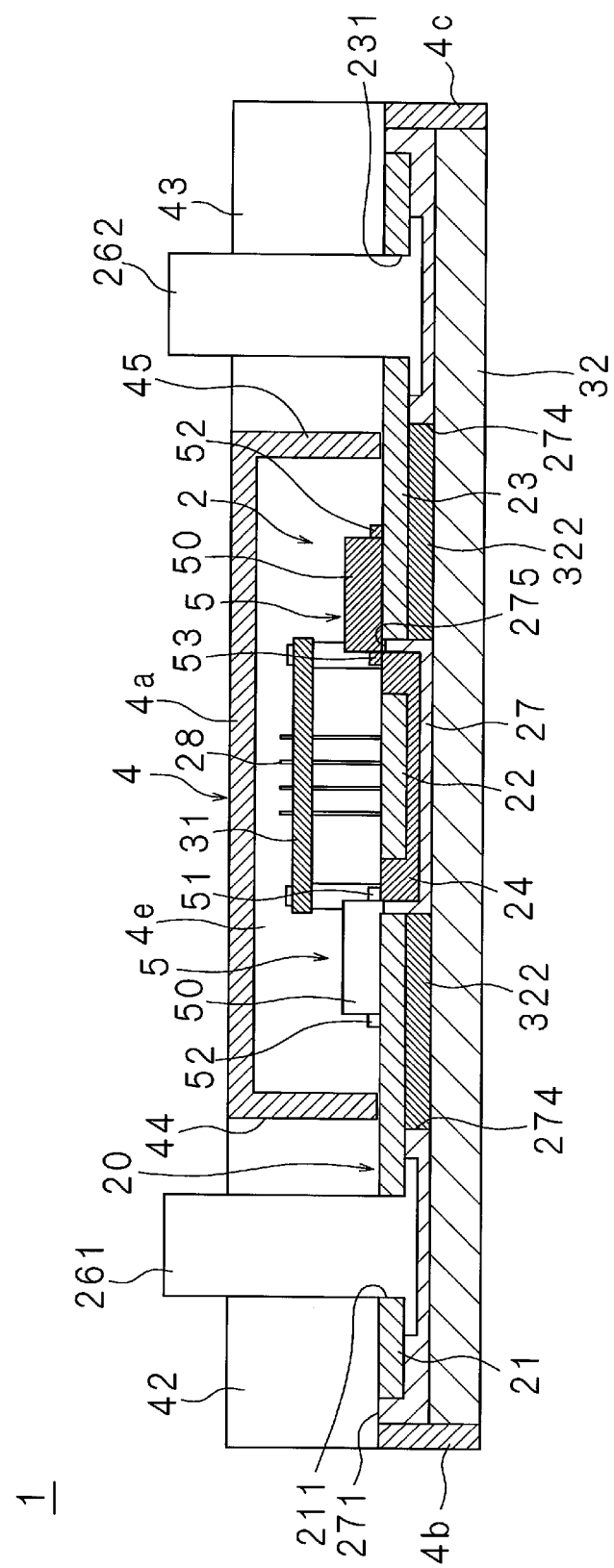
FIG. 2 is a cross sectional view of the electrical junction box.

FIG. 2 is a cross sectional view of the electrical junction box.

Figure 3:
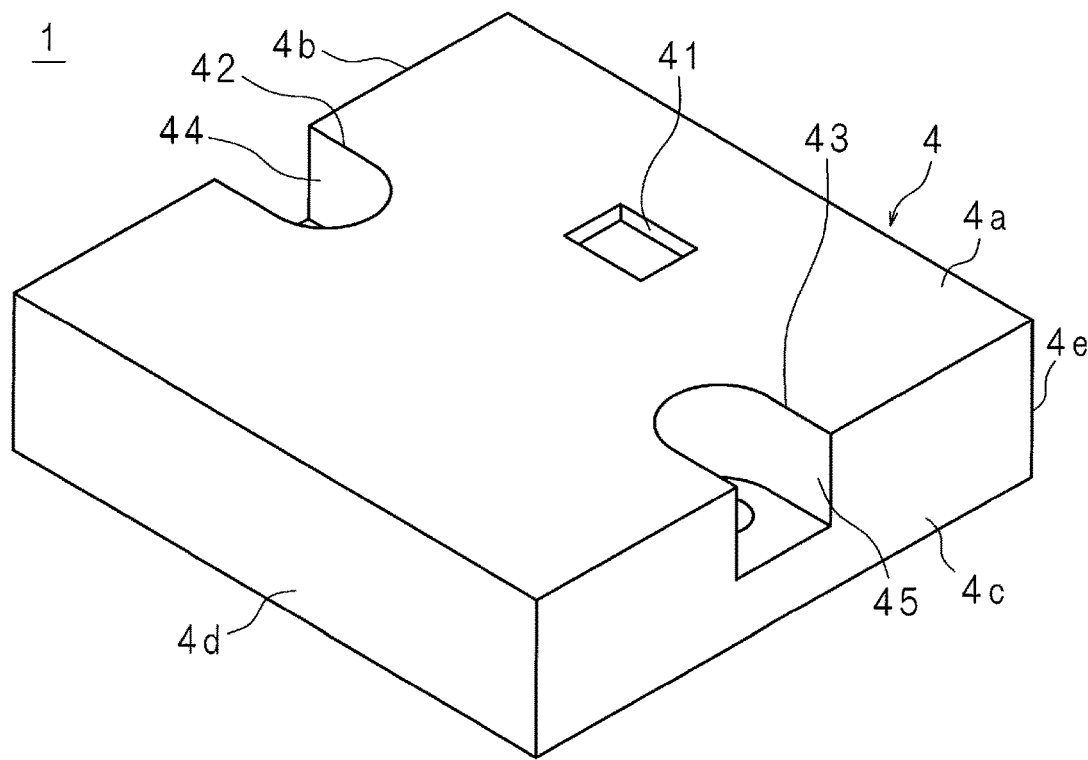
FIG. 3 is an exploded perspective view of the electrical junction box.
Figure 3:
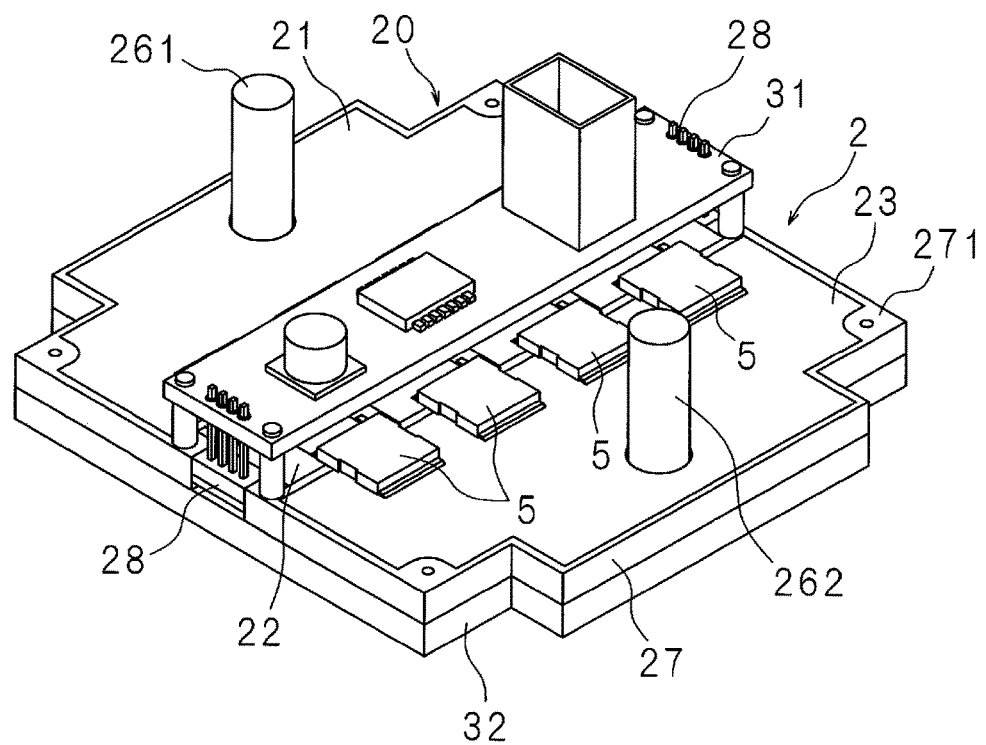

FIG. 3 is an exploded perspective view of the electrical junction box.

Reference numeral 1 in the drawings indicates the electrical junction box, and the electrical junction box 1 includes an electrical connection device 2, a circuit board 31, a heat dissipation member 32, and a cover 4. The electrical connection device 2 includes a first bus bar 21 (a second conductive plate), a second bus bar 22 (a first conductive plate), a third bus bar 23 (a third conductive plate), an insulator 24, eight conductive paths 25 (see FIG. 4) and two bolts 261 and 262.

Figure 4:
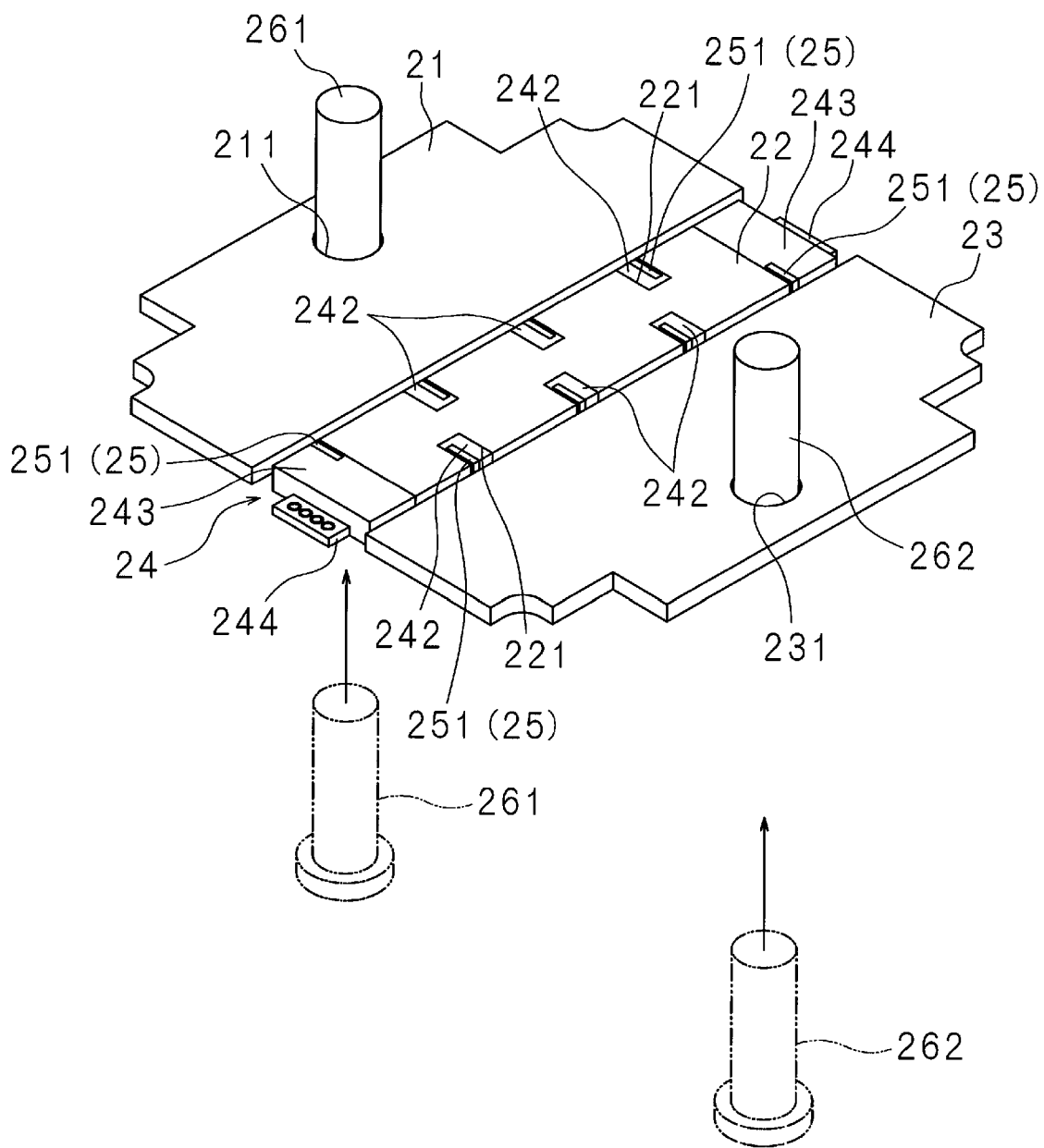
FIG. 4 is a perspective view of a first bus bar, a second bus bar, a third bus bar, an insulator, conductive paths, and bolts.

FIG. 4 is a perspective view of the first bus bar 21, the second bus bar 22, the third bus bar 23, the insulator 24, the conductive paths 25, and the bolts 261 and 262.

As shown in FIGS. 2 to 4, the first bus bar 21 has a rectangular plate shape. An open hole 211 is provided in one long side of the first bus bar 21. The open hole 211 is arranged at the center of the first bus bar 21 in the longitudinal direction. The first bus bar 21 has conductivity, and is made of metal, for example.

The shaft portion of the bolt 261 is caulked to the open hole 211 of the first bus bar 21. The shaft portion of the bolt 261 protrudes from one surface of the first bus bar 21 in a direction orthogonal to the one surface of the first bus bar 21. The head portion of the bolt 261 is in contact with the other surface of the first bus bar 21.

The configuration of the third bus bar 23 is the same as that of the first bus bar 21. The shaft portion of the bolt 262 is caulked to an open hole 231 of the third bus bar 23.

Figure 5:
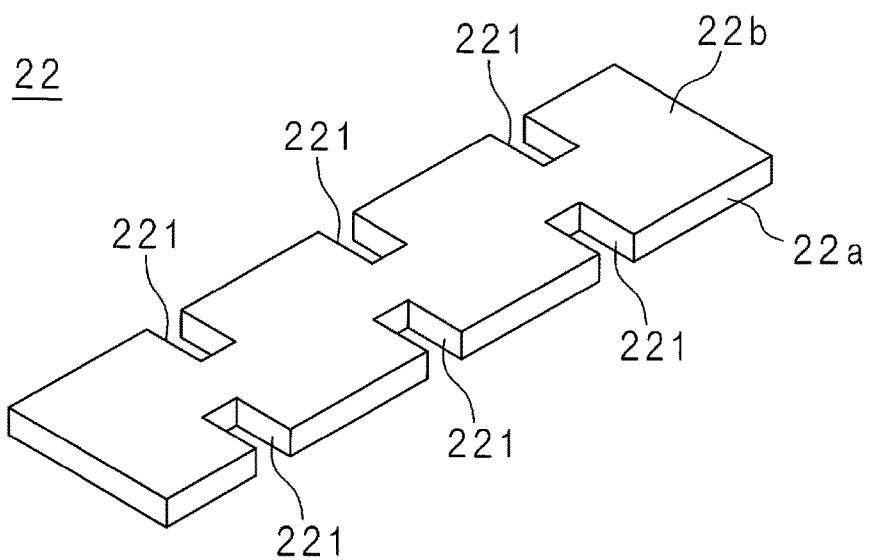
FIG. 5 is a perspective view of the second bus bar alone.

FIG. 5 is a perspective view of the second bus bar 22 alone.

As shown in FIGS. 2, 4, and 5, the second bus bar 22 has a rectangular plate shape. Three cutouts 221 are provided side by side in each long side of the second bus bar 22. The three cutouts 221 on one long side of the second bus bar 22 and the three cutouts 221 on the other long side of the second bus bar 22 are arranged in a staggered manner. Each cutout 221 has a rectangular shape. The downward and upward surfaces of the second bus bar 22 shown in FIG. 5 are hereinafter referred to as a lower surface 22a and an upper surface 22b of the second bus bar 22, respectively.

The thicknesses of the first bus bar 21, the second bus bar 22, and the third bus bar 23 are substantially the same.

The second bus bar 22 is provided integrally with the insulator 24.

Figure 6:
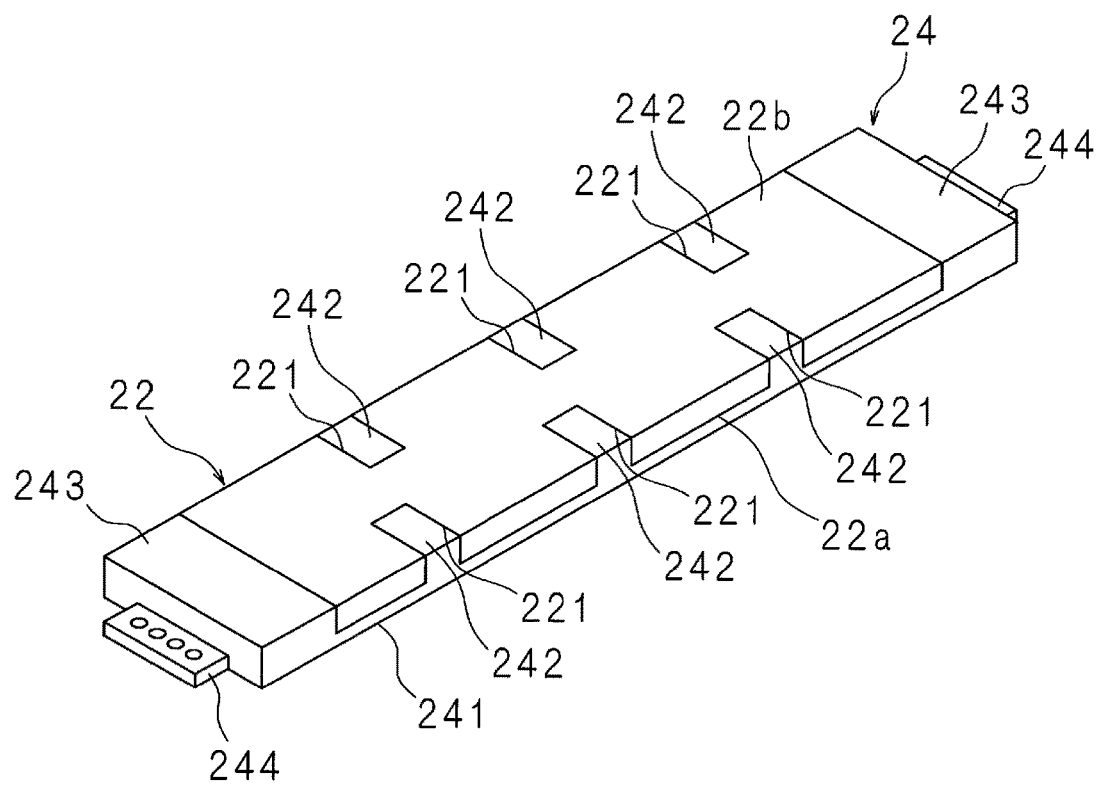
FIG. 6 is a perspective view showing a state in which the insulator is provided on the second bus bar.

FIG. 6 is a perspective view showing a state in which the insulator 24 is provided on the second bus bar 22.

The insulator 24 is a component in which a large number of metal particles are dispersed in an insulating synthetic resin. The insulator 24 integrally includes an insulating layer 241, six terminal receivers 242, two terminal receivers 243, and two protruding pieces 244.

The insulating layer 241 is layered below the lower surface 22a of the second bus bar 22, and covers the six cutouts 221 of the second bus bar 22.

The terminal receivers 242 are embedded in the cutouts 221 of the second bus bar 22. Each terminal receiver 242 is continuous with a portion of the insulating layer 241 covering the cutout 221. The terminal receiver 242 has a surface flush with the upper surface 22b (the surface on which the insulating layer 241 is not stacked) of the second bus bar 22.

The two terminal receivers 243 are arranged at the two ends in the longitudinal direction of the second bus bar 22. Each terminal receiver 243 is continuous with the insulating layer 241. The terminal receiver 243 has a surface flush with the upper surface 22b of the second bus bar 22.

The two protruding pieces 244 protrude from the two terminal receivers 243 in opposite directions. The protruding direction of the protruding pieces 244 is the longitudinal direction of the second bus bar 22.

The second bus bar 22 integrally provided with the insulator 24 can be easily formed by insert molding in which the synthetic resin containing metal particles is injected into a mold into which the second bus bar 22 is inserted.

Figure 7:
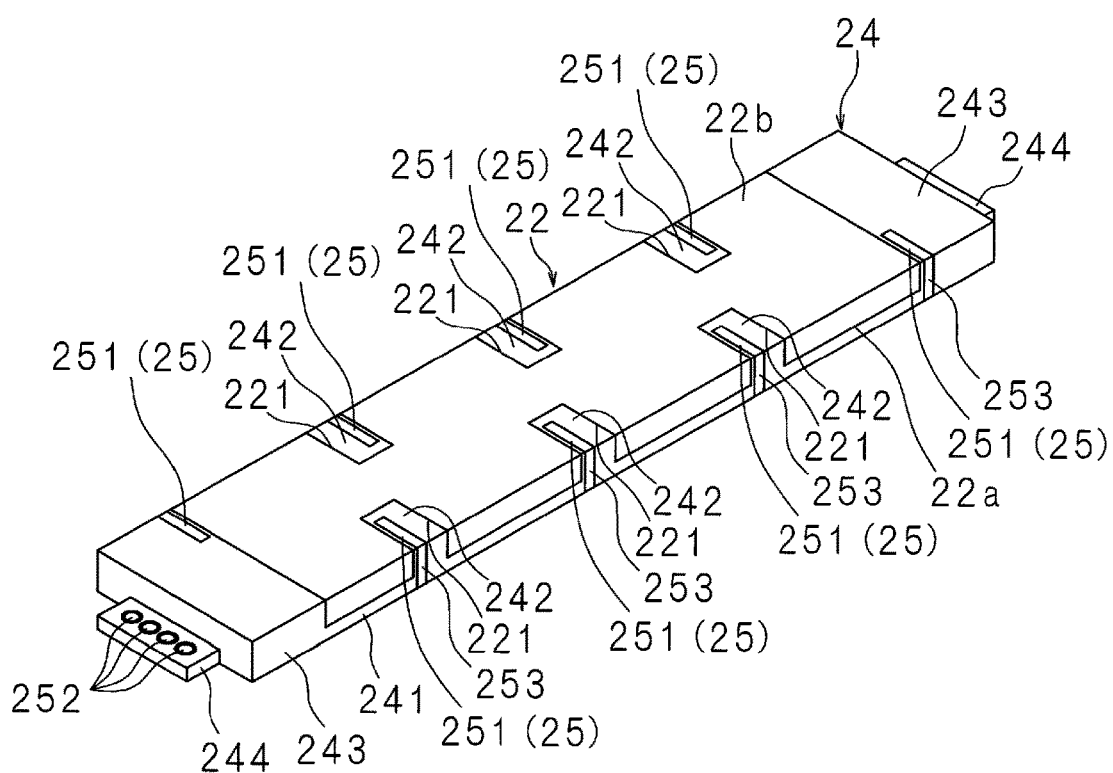
FIG. 7 is a perspective view showing a state in which the conductive paths are provided in the insulator.
Figure 8:
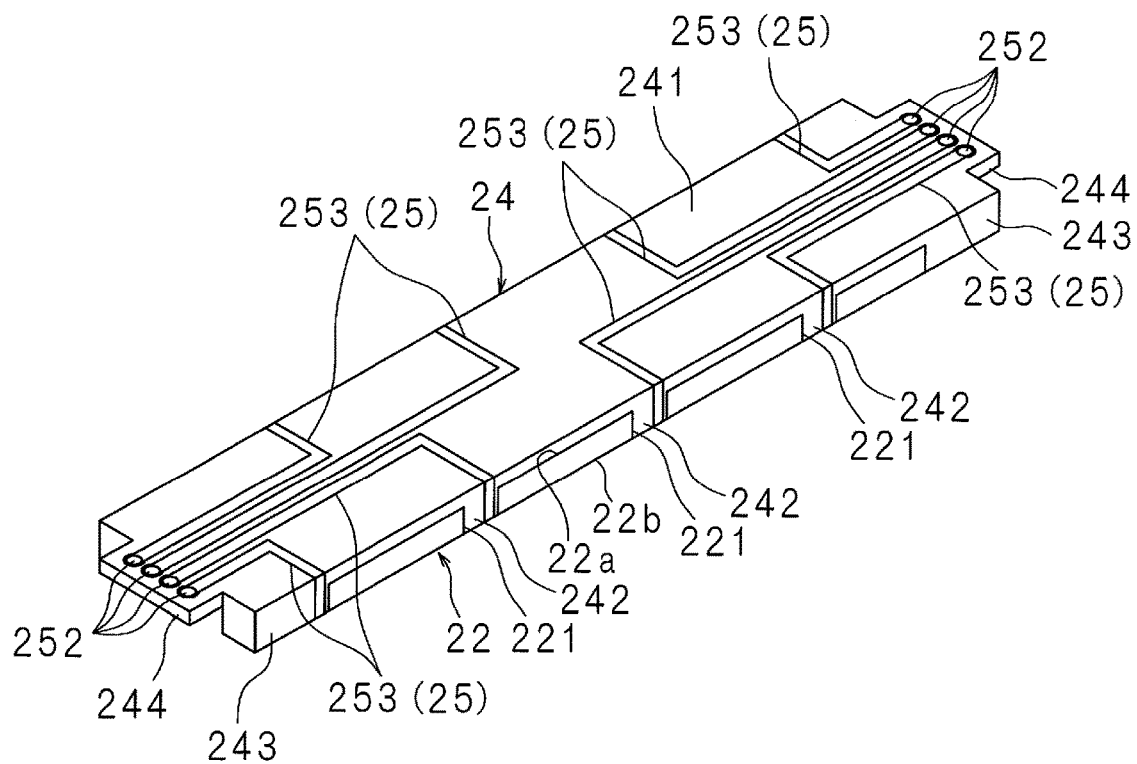
FIG. 8 is another perspective view showing a state in which the conductive paths are provided in the insulator.

FIG. 7 is a perspective view showing a state in which the conductive paths 25 are provided in the insulator 24. FIG. 8 is another perspective view showing a state in which the conductive paths 25 are provided in the insulator 24. FIG. 7 (and FIG. 8) shows a stacked body in which the second bus bar 22 and the insulating layer 241 are stacked on each other as viewed from the second bus bar 22 side (the insulating layer 241 side).

The conductive paths 25 are provided on the surface of the insulator 24. Each conductive path 25 includes a connection portion 251, a through hole 252, and a wiring portion 253.

The connection portions 251 are provided for each of the six terminal receivers 242 and the two terminal receivers 243 of the insulator 24 (eight in total).

The connection portions 251 provided on the terminal receivers 242 are provided on a surface of the terminal receiver 242, which is flush with the upper surface 22b of the second bus bar 22. Each connection portion 251 is arranged close to the circumferential edge of the cutout 221 of the second bus bar 22, but the connection portion 251 and the second bus bar 22 are insulated by the insulator 24.

The connection portions 251 provided on the terminal receivers 243 are provided on a surface of the terminal receiver 243, which is flush with the upper surface 22b of the second bus bar 22. Each connection portion 251 is arranged close to the short side of the second bus bar 22, but the connection portion 251 and the second bus bar 22 are insulated by the insulator 24.

Four through holes 252 of the eight conductive paths 25 are provided on each of the two protruding pieces 244 of the insulator 24.

The connection portion 251 of the conductive path 25 and the through hole 252 are electrically connected via the wiring portion 253. The wiring portion 253 is continuous with the connection portion 251 provided in the terminal receiver 242, and is continuous with the through hole 252 through the terminal receiver 242, the insulating layer 241, the terminal receiver 243, and the protruding piece 244. Alternatively, the wiring portion 253 is continuous with the connection portion 251 provided in the terminal receiver 243, and is continuous with the through hole 252 through the terminal receiver 243 and the protruding piece 244.

The conductive paths 25 are provided as shown in FIGS. 7 and 8 by, for example, irradiating the insulator 24 shown in FIG. 6 with a laser beam and further plating. The conductive path 25 provided by laser beam irradiation and plating can be easily miniaturized.

The insulator 24 provided with the conductive paths 25 functions as a printed wiring board with integrated second bus bar 22.

As shown in FIGS. 2 and 3, the first bus bar 21 to which the bolt 261 is fixed, the second bus bar 22 provided with the insulator 24 including the conductive paths 25, and the third bus bar 23 to which the bolt 262 is fixed are integrated with each other by an insulating portion 27 in such that they do not contact each other. The insulating portion 27 is made of a synthetic resin.

In the following, a component in which the first bus bar 21, the second bus bar 22, the third bus bar 23, the insulator 24, the conductive paths 25, and the bolts 261 and 262 are integrated is referred to as a base 20.

Figure 9:
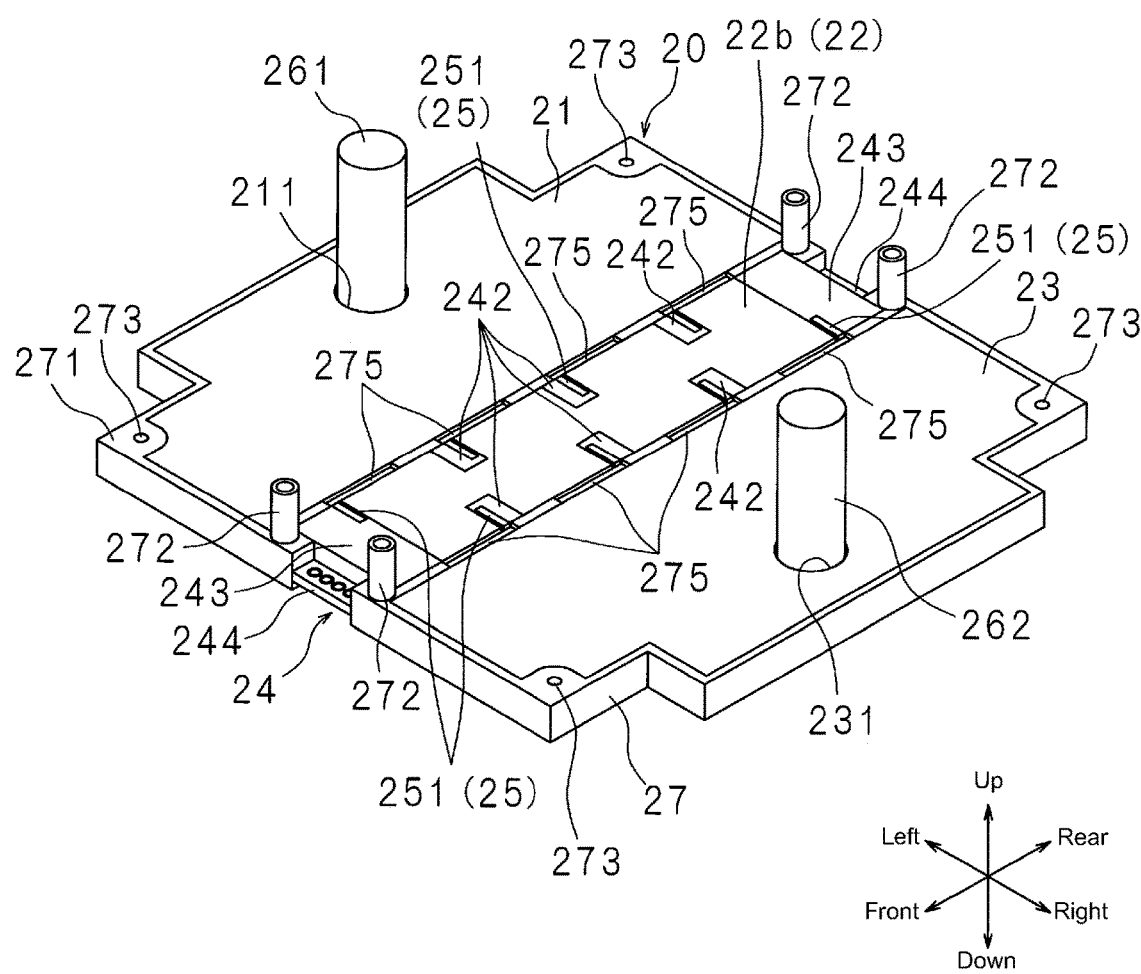
FIG. 9 is a perspective view of a base.
Figure 10:
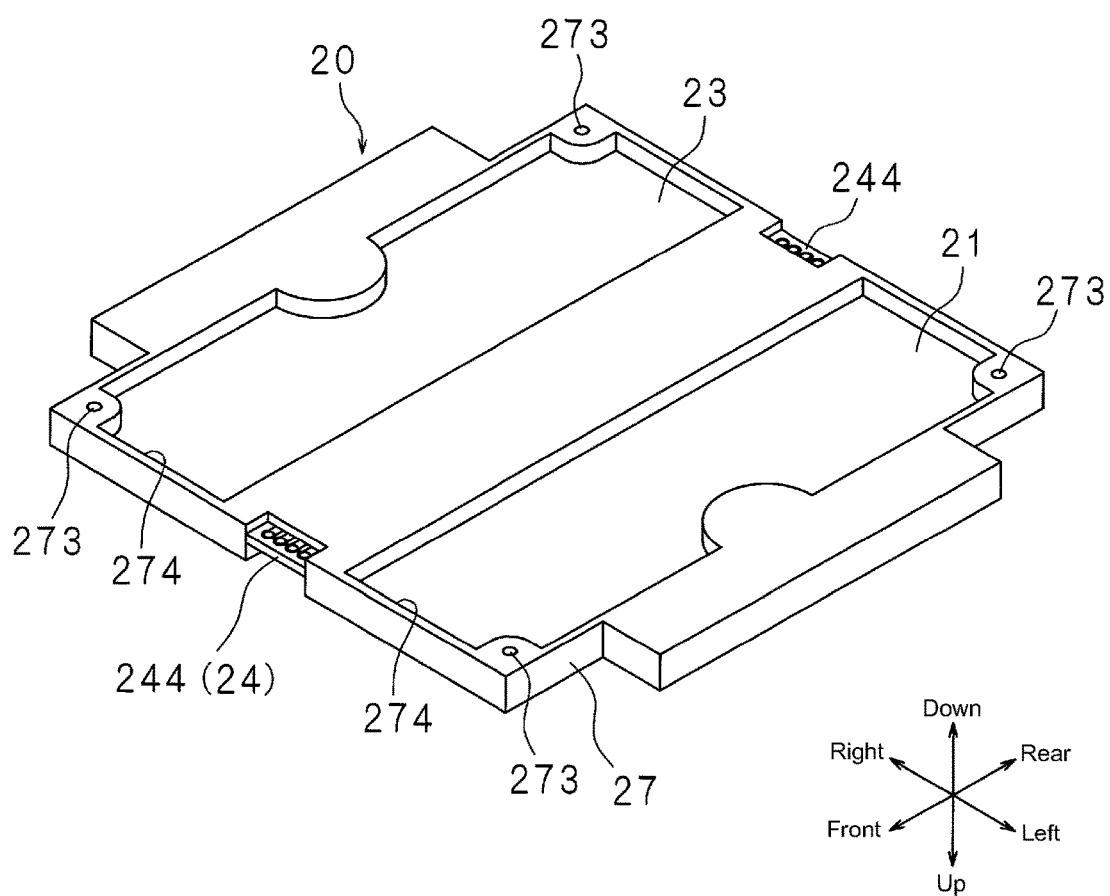
FIG. 10 is another perspective view of the base.

FIG. 9 is a perspective view of the base 20. FIG. 10 is another perspective view of the base 20. In the following, the present embodiment will be described using the up-down and left-right directions shown in FIGS. 9 and 10.

That is to say, FIG. 9 is a perspective view of the base 20 as viewed from above, and FIG. 10 is a perspective view of the base 20 as viewed from below. The longitudinal direction of the first bus bar 21 is "front-back direction", the short edge direction of the first bus bar 21 is "left-right direction", and the direction orthogonal to the first bus bar 21 is "up-down direction". Also, the side of the first bus bar 21 from which the shaft portion of the bolt 261 protrudes is "upper side". The open hole 211 is provided on the left side of the first bus bar 21.

In the base 20, the first bus bar 21, the second bus bar 22, and the third bus bar 23 are arranged side by side in this order from left to right such that their longitudinal directions are parallel. The upper surface 22b of the second bus bar 22 faces upward.

The lower surface and the side surface of the first bus bar 21 and the head portion of the bolt 261 are covered with the insulating portion 27. The upper surface of the first bus bar 21 and the shaft portion of the bolt 261 are not covered with the insulating portion 27.

The left side surface of the second bus bar 22 faces the right side surface of the first bus bar 21. The insulating portion 27 is provided between the right side surface of the first bus bar 21 and the left side surface of the second bus bar 22. The upper surface (and the lower surface) of the first bus bar 21 and one surface (and the other surface) of the second bus bar 22 are virtually coplanar.

The second bus bar 22, the insulator 24, and the conductive paths 25 are covered with the insulating portion 27 such that at least the upper surface 22b of the second bus bar 22, the protruding pieces 244 of the insulator 24, and the connection portions 251 of the conductive paths 25 are exposed.

The third bus bar 23 is arranged such that the surface from which the shaft portion of the bolt 262 protrudes faces upward, and the long side portion in which the open hole 231 is provided faces right.

The right side surface of the second bus bar 22 faces the left side surface of the third bus bar 23. The insulating portion 27 is provided between the left side surface of the third bus bar 23 and the right side surface of the second bus bar 22. The upper surface (and the lower surface) of the third bus bar 23 and one surface (and the other surface) of the second bus bar 22 are virtually coplanar.

The lower surface and the side surface of the third bus bar 23 and the head portion of the bolt 262 are covered with the insulating portion 27. The upper surface of the third bus bar 23 and the shaft portion of the bolt 262 are not covered with the insulating portion 27.

Four of the connection portions 251 of the eight conductive paths 25 are arranged along the right side of the first bus bar 21, and the remaining four of the connection portions 251 are arranged along the left side of the third bus bar 23. The connection portions 251 on the left side extend along the front side of the second bus bar 22, or along the rear side of the cutouts 221 on the left side of the second bus bar 22 (see FIG. 7). The connection portions 251 on the right side extend along the rear side of the second bus bar 22, or along the front side of the cutouts 221 on the right side of the second bus bar 22 (see FIG. 7).

The upper surface 271 of the insulating portion 27 is flush with the upper surfaces of the first bus bar 21, the second bus bar 22, the third bus bar 23, and the terminal receivers 242 of the insulator 24 (see FIG. 2). Four bosses 272 protrude upward from the upper surface 271. The four bosses 272 are adjacent to the four corners of the second bus bar 22. A female screw is provided on the inner surface of each boss 272.

A plurality of screw holes 273 are provided in the insulating portion 27 to penetrate the insulating portion 27 in the up-down direction.

The insulating portion 27 is provided with two openings 274. The two openings 274 are located below the first bus bar 21 and the third bus bar 23 (see FIG. 2). Wide areas on the lower surfaces of the first bus bar 21 and the third bus bar 23 are exposed through the two openings 274.

Eight recessed portions 275 are provided on the upper surface 271 of the insulating portion 27. Four recessed portions 275 of the eight recessed portions 275 are arranged between the first bus bar 21 and the second bus bar 22, and the remaining four recessed portions 275 are arranged between the second bus bar 22 and the third bus bar 23.

The electrical junction box 1 further includes eight switching elements 5 (see FIG. 3).

Figure 11:
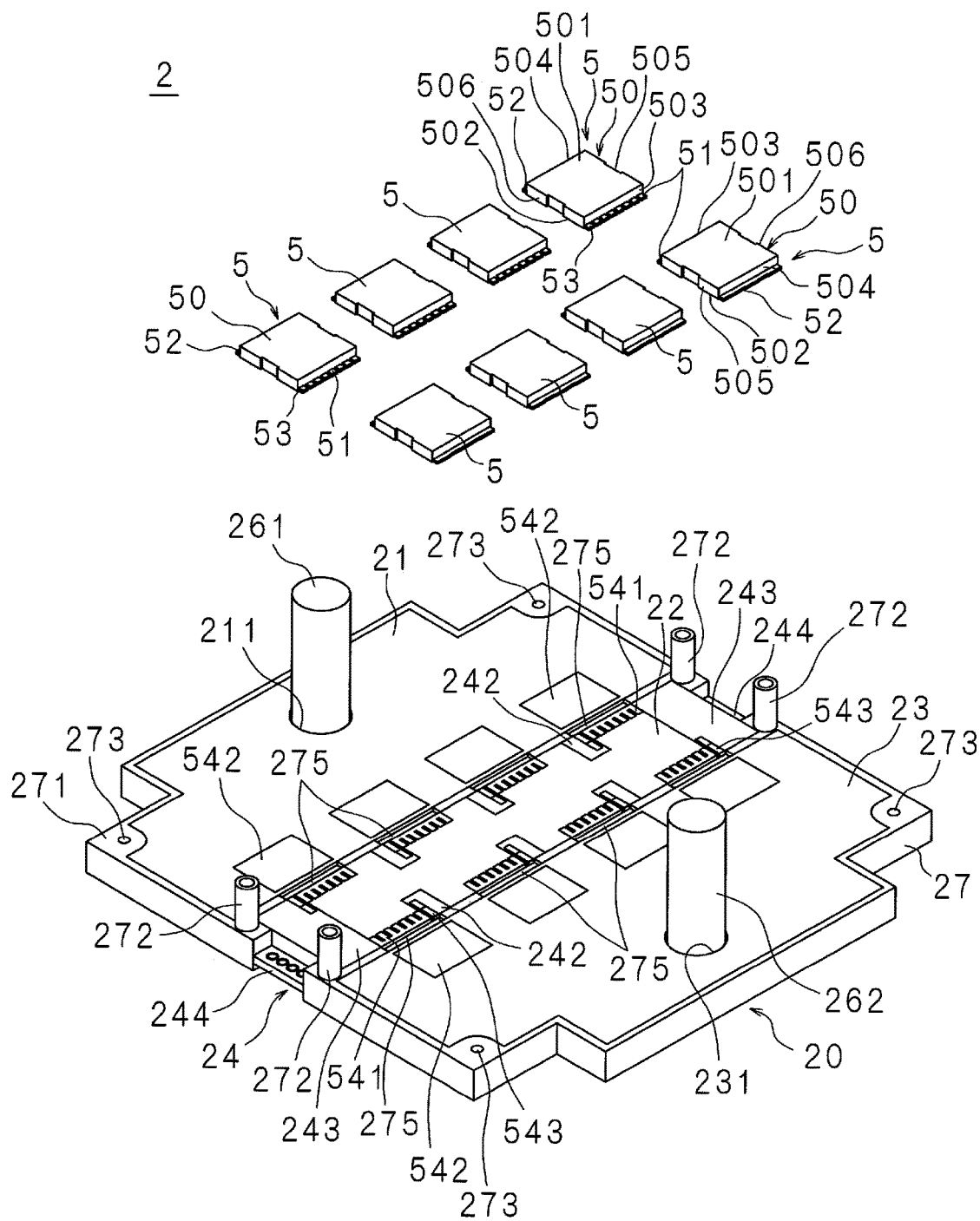
FIG. 11 is a perspective view illustrating how switching elements are attached to the base.

FIG. 11 is a perspective view illustrating how the switching elements 5 are attached to the base 20.

The switching elements 5 are FETs, and each include an element body 50, a source terminal 51, a drain terminal 52, and a gate terminal 53. The switching element 5 is turned on or off according to a voltage of the gate terminal 53.

The eight switching elements 5 are attached to the base 20 such that four element main bodies 50 are arranged in the front-rear direction, and two in the left-right direction.

The source terminal 51, the drain terminal 52, and the gate terminal 53 of the switching element 5 on the left side (on the first bus bar 21 side) are the first terminal, the second terminal, and the control terminal, respectively.

The switching elements 5 on the right side (on the third bus bar 23 side) are the second switching elements. The source terminal 51, the drain terminal 52, and the gate terminal 53 of the switching element 5 on the right side are the third terminal, the fourth terminal, and the second control terminal, respectively.

The element body 50 has a flat rectangular parallelepiped shape. The element body 50 is arranged on the base 20 such that two surfaces having the largest areas among the six surfaces of the element body 50 face up and down, and long sides of these surfaces face forward and backward. In the following, the two surfaces having the largest areas of the element body 50 are referred to as an upper surface 501 and a lower surface 502, respectively. Also, the two surfaces continuous with the long sides of the upper surface 501 are referred to as side surfaces 503 and 504, and the two surfaces continuous with the short sides of the upper surface 501 are referred to as side surfaces 505 and 506.

The source terminal 51 is provided on the side surface 503 of the element body 50. The source terminal 51 has a plurality of protrusions protruding from the side surface 503 in a direction orthogonal to the side surface 503. The lower surface of the source terminal 51 and the lower surface 502 of the element body 50 are virtually coplanar.

The gate terminal 53 is provided on the side surface 503 of the element body 50. The gate terminal 53 protrudes from the side surface 503 in a direction orthogonal to the side surface 503. The lower surface of the gate terminal 53 and the lower surface 502 of the element body 50 are virtually coplanar.

The source terminal 51 and the gate terminal 53 are adjacent in the front-back direction. The source terminal 51 is located on the side surface 503 on the side closer to the side surface 505. On the other hand, the gate terminal 53 is located on the side surface 503 on the side closer to the side surface 506.

The drain terminal 52 is provided on the lower surface 502 and the side surface 504 of the element body 50. The drain terminal 52 has a foil portion that covers the lower surface 502, and an extension portion that is continuous with the foil portion and extends from the side surface 504 in a direction orthogonal to the side surface 504. Because the foil portion of the drain terminal 52 is sufficiently thin, the thickness of the foil portion can be ignored.

Four of the eight switching elements 5 are connected to the first bus bar 21, and the remaining four are connected to the third bus bar 23.

Each switching element 5 connected to the first bus bar 21 is connected to the first bus bar 21, the second bus bar 22, and the conductive path 25 such that the side surface 503 provided with the source terminal 51 and the gate terminal 53 faces rightward and the side surface 505 close to the source terminal 51 faces rearward.

Specifically, the source terminal 51 is connected to a portion of the upper surface 22b of the second bus bar 22 on the rear side of the insulator 24 by solder 541. Also, the drain terminal 52 is connected to the upper surface of the first bus bar 21 by solder 542. Furthermore, the gate terminal 53 is connected to the connection portion 251 of the conductive path 25 by solder 543.

The element body 50 of the switching element 5 connected to the first bus bar 21 partially covers the portion between the first bus bar 21 and the second bus bar 22. The recessed portion 275 of the insulating portion 27 arranged between the first bus bar 21 and the second bus bar 22 is located below the element body 50. That is to say, the insulating portion 27 between the first bus bar 21 and the second bus bar 22 is not in contact with the switching element 5.

Each switching element 5 connected to the third bus bar 23 is connected to the second bus bar 22, the third bus bar 23, and the conductive path 25 such that the side surface 503 provided with the source terminal 51 and the gate terminal 53 faces leftward and the side surface 505 close to the source terminal 51 faces frontward.

Specifically, the source terminal 51 is connected to a portion of the upper surface 22b of the second bus bar 22 on the front side of the insulator 24 by the solder 541. Also, the drain terminal 52 is connected to the upper surface of the third bus bar 23 by the solder 542. Furthermore, the gate terminal 53 is connected to the connection portion 251 of the conductive path 25 by the solder 543.

The element body 50 of the switching element 5 connected to the third bus bar 23 partially covers the portion between the third bus bar 23 and the second bus bar 22. The recessed portion 275 of the insulating portion 27 arranged between the third bus bar 23 and the second bus bar 22 is located below the element body 50. That is to say, the insulating portion 27 between the third bus bar 23 and the second bus bar 22 is not in contact with the switching element 5.

The electrical connection device 2 further includes two connection members 28.

Figure 12:
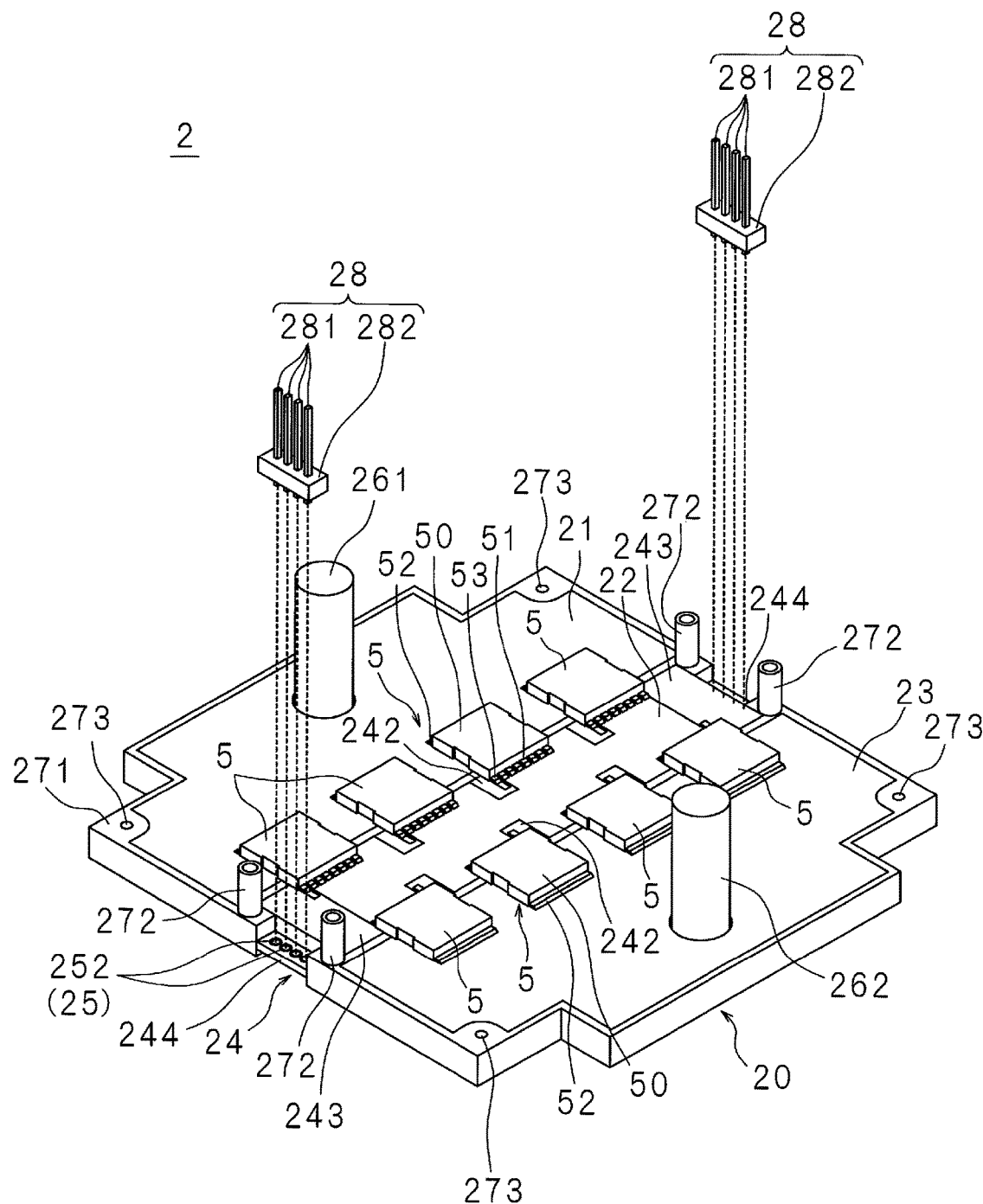
FIG. 12 is a perspective view illustrating how connection members are attached to the base.

FIG. 12 is a perspective view illustrating how the connection members 28 are attached to the base 20.

Each connection member 28 includes four connection pins 281 and a holder 282.

The four connection pins 281 are arranged in parallel with each other. The holder 282 holds the four connection pins 281 such that the two ends of each connection pin 281 protrude from the holder 282.

One end portion of the connection pins 281 of one (and the other) connection member 28 is fitted into the through holes 252 of the conductive paths 25 provided in the protruding piece 244 on the front side (and the rear side) of the insulator 24, such that the other end portion of the connection pins 281 faces upward.

Figure 13:
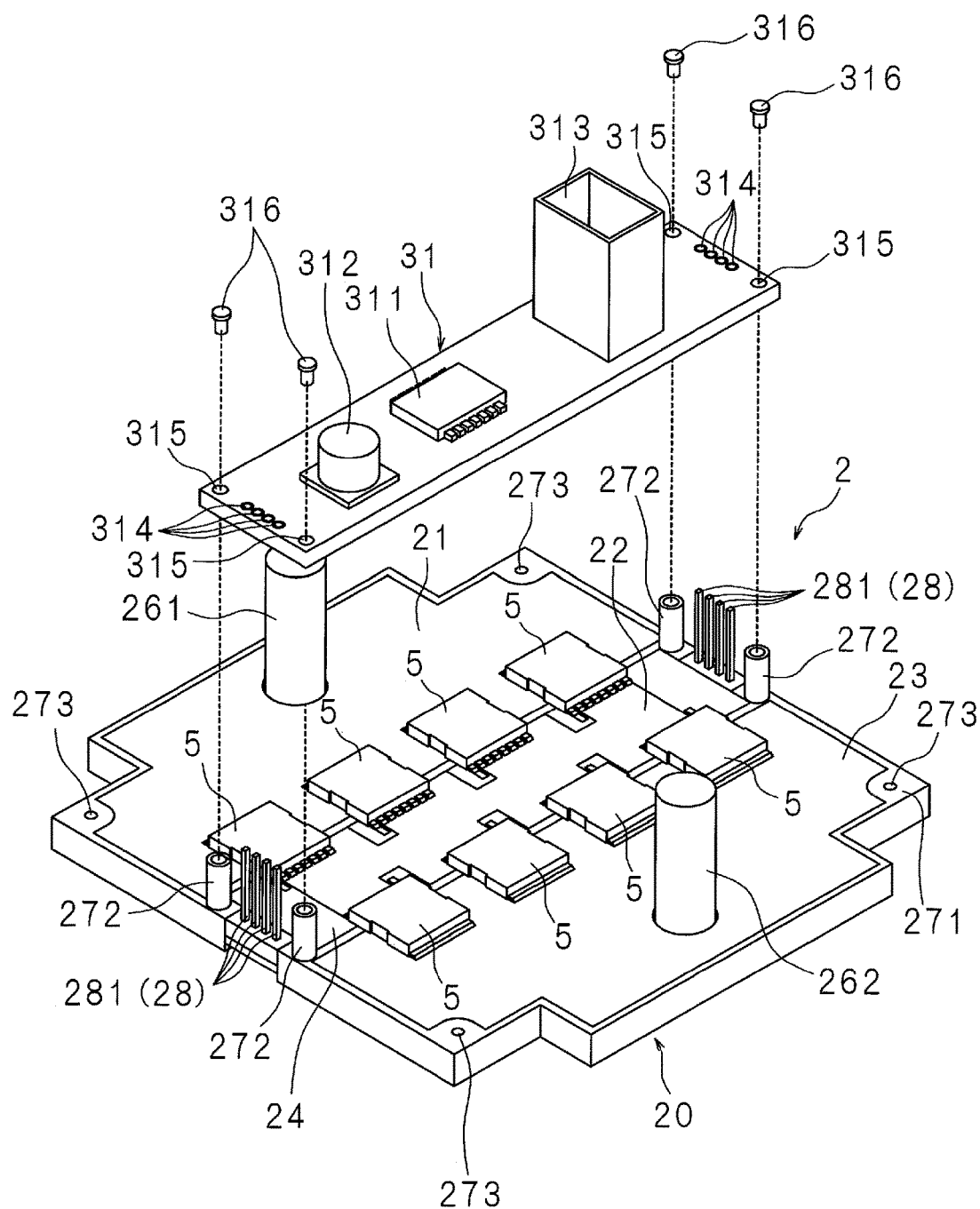
FIG. 13 is a perspective view illustrating how a circuit board is attached to the base.

FIG. 13 is a perspective view illustrating how the circuit board 31 is attached to the base 20.

The circuit board 31 has a rectangular shape. Conductive paths made of a metal foil are provided on one surface of the circuit board 31. In addition, a control element 311, a drive circuit 312, and a connector 313 are mounted on the one surface of the circuit board 31. The connector 313 is not shown in FIG. 2.

As shown in FIG. 13, on each short side of the circuit board 31, four through holes 314 are arranged side by side along the short edge direction of the circuit board 31. Four insertion holes 315 are provided at four corners of the circuit board 31.

The control element 311 is a microprocessor, for example. The control element 311 is electrically connected to the drive circuit 312 and the connector 313 via the conductive paths of the circuit board 31. The drive circuit 312 is electrically connected to the through holes 314 via the conductive paths of the circuit board 31.

The circuit board 31 is attached to the base 20 such that the control element 311 and the connector 313 face upward and the conductive paths 25 and the control element 311 are electrically connected. Specifically, the connection pins 281 of the front connection member 28 are fitted into the through holes 314 on one short side of the circuit board 31. Also, the connection pins 281 of the rear connection member 28 are fitted into the through holes 314 on the other short side of the circuit board 31. Furthermore, the circuit board 31 is screwed to the base 20 by inserting screws 316 into the insertion holes 315 and screwing the screws 316 into the bosses 272. The circuit board 31 and the second bus bar 22 face each other across a gap. The circuit board 31 and the second bus bar 22 are parallel to each other.

Figure 14:
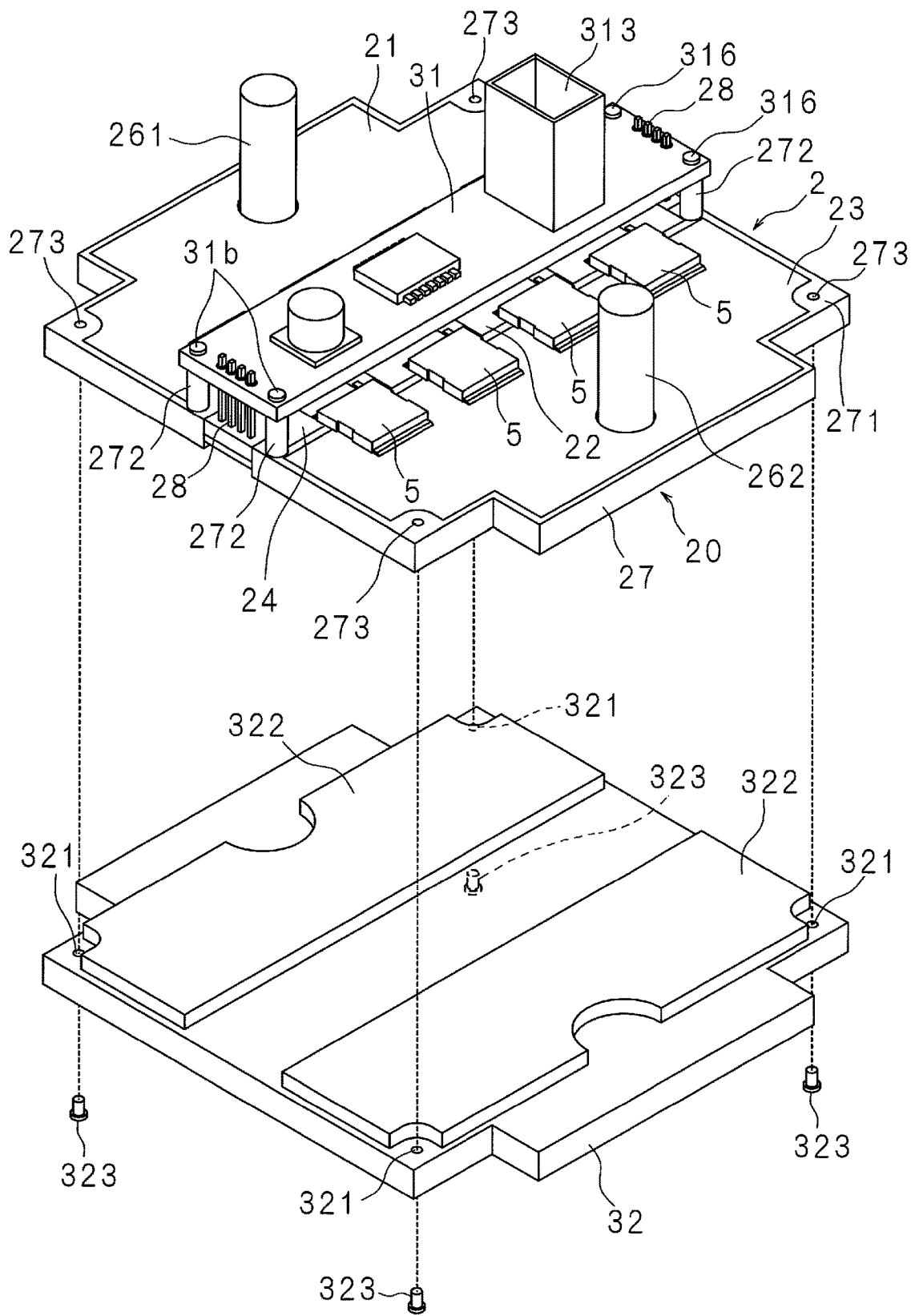
FIG. 14 is a perspective view illustrating how a heat dissipation member is attached to the base.

FIG. 14 is a perspective view illustrating how a heat dissipation member 32 is attached to the base 20.

The heat dissipation member 32 has a plate shape. The heat dissipation member 32 is provided with a plurality of open holes 321. The open holes 321 correspond to screw holes 273 of the base 20. On one surface 32a of the heat dissipation member 32, two heat conducting portions 322 are provided in correspondence with the two openings 274 on the base 20 (see FIG. 10). Each heat conducting portion 322 has insulating properties and high heat conductivity, and is heat conducting grease applied to one surface of the heat dissipation member 32, for example.

The heat dissipation member 32 is attached to the base 20, such that the heat conducting portions 322 face upward and the first bus bar 21 and the third bus bar 23 are attached to the heat dissipation member 32 via the heat conducting portions 322. Specifically, the two heat conducting portions 322 fill the two openings 274 of the base 20, and come into contact with the first bus bar 21 and the third bus bar 23 (see FIG. 2). Also, the heat dissipation member 32 is screwed to the base 20 by the screws 323 passing through the open holes 321 and screwing them into the screw holes 273.

As shown in FIGS. 1 to 3, the cover 4 has a box shape with one side open. The cover 4 has insulating properties, and is made of a synthetic resin, for example. The cover 4 includes a bottom wall 4a and four side walls 4b to 4e. The bottom wall 4a has a rectangular shape. The side walls 4b to 4e stand in the same direction from the four sides of the bottom wall 4a. The side walls 4b and 4c are parallel to each other, and the side walls 4d and 4e are parallel to each other.

An opening 41 is provided at the center of the bottom wall 4a. An opening 42 is provided at the center of one side extending along the side wall 4b of the bottom wall 4a. The opening 42 extends over the bottom wall 4a and the side wall 4b. An opening 43 is provided at the center of one side extending along the side wall 4c of the bottom wall 4a. The opening 43 extends over the bottom wall 4a and the side wall 4c.

The cover 4 includes two partition plates 44 and 45. The partition plates 44 and 45 partition the inside of the cover 4.

The partition plates 44 and 45 have a semi-cylindrical shape, and the axial direction of the partition plates 44 and 45 is orthogonal to the bottom wall 4a. The partition plate 44 rises from the circumferential edge of the opening 42 of the bottom wall 4a, and the circumferential wall of the partition plate 44 is continuous with the circumferential edge of the opening 42 of the side wall 4b. The partition plate 45 has substantially the same configuration of the partition plate 44, and is provided on the circumferential edge of the opening 43.

The cover 4 is attached to the base 20 such that the bottom wall 4a of the cover 4 and the circuit board 31 are parallel to each other and the side wall 4b faces left. The connector 313 of the circuit board 31 is fitted into the opening 41 of the cover 4. As a result, the shaft portions of the bolts 261 and 262, the opening circumferential edge portion of the open hole 211 of the first bus bar 21 and the opening circumferential edge portion of the open hole 231 of the third bus bar 23 are exposed through the openings 42 and 43. The cover 4 attached to the base 20 covers the eight switching elements 5 and the circuit board 31.

The electrical junction box 1 shown in FIGS. 1 to 3 is installed in, for example, a vehicle (not shown). A cable that is connected to, for example, a power source is connected to the first bus bar 21 using the bolt 261. A cable that is connected to, for example, a load is connected to the third bus bar 23 using the bolt 262. A signal line that is connected to, for example, an ECU (Electronic Control Unit) (not shown) is connected to the connector 313.

The control element 311 of the circuit board 31 communicates with the ECU via the connector 313. Also, the control element 311 outputs a control signal for switching on and off the switching elements 5 to the drive circuit 312. The drive circuit 312 applies a voltage for switching on and off the switching elements 5 to the gate terminals 53 of the switching elements 5, according to the control signal input from the control element 311.

If the eight switching elements 5 are turned on, the source terminals 51 and the drain terminals 52 of the switching elements 5 are electrically connected, so that the first bus bar 21, the second bus bar 22, and the third bus bar 23 are electrically connected to each other. At this time, a current flows through the cable connected to the power source, the first bus bar 21, the four switching elements 5 on the left side, the second bus bar 22, the four switching elements 5 on the right side, the third bus bar 23, and the cable connected to the load, and power is supplied from the power source to the load.

If the switching elements 5 are turned off, the source terminals 51 and the drain terminals 52 of the switching elements 5 are electrically disconnected, so that the first bus bar 21, the second bus bar 22, and the third bus bar 23 are electrically disconnected. At this time, the current flowing through the cable connected to the power source, the first bus bar 21, the four switching elements 5 on the left side, the second bus bar 22, the four switching elements 5 on the right side, the third bus bar 23, and the cable connected to the load is cut off, and the power supply from the power source to the load is stopped.

If a current flows thorough the switching element 5, the switching element 5 generates heat. The heat generated by the switching element 5 is transmitted to the first bus bar 21 or the third bus bar 23, the heat conducting portions 322, and the heat dissipation member 32 in this order, and is released to the outside of the electrical junction box 1.

The recessed portion 275 is provided below the element body 50 of the switching element 5. Accordingly, for example, if the switching element 5 generates heat, the insulating portion 27 around the switching element 5 can thermally expand toward the recessed portion 275. That is to say, the recessed portions 275 function as a clearance for the insulating portion 27.

With the electrical connection device 2 as described above, because the conductive path 25 can be easily miniaturized, the second bus bar 22 and the conductive path 25 can be sufficiently separated from each other, even if the separation distance between the source terminal 51 and the gate terminal 53 of the switching element 5 is short.

Therefore, a small switching element in which the source terminal 51 and the gate terminal 53 are arranged close to each other can be used as the switching element 5. As a result, the size of the electrical connection device 2 can be reduced.

Because the insulating portion 27 is provided between the first bus bar 21 (or the third bus bar 23) and the second bus bar 22, short circuit between the first bus bar 21 (or the third bus bar 23) and the second bus bar 22 is prevented.

The base 20 formed by integrating the first bus bar 21, the second bus bar 22, the third bus bar 23, and the like is easy to handle when assembling the electrical junction box 1. The base 20 can be easily formed by insert molding in which a synthetic resin is injected into a mold into which the first bus bar 21, the second bus bar 22, the third bus bar 23, and the like are inserted.

The embodiment disclosed this time is an example in all respects, and should be considered as not restrictive. The scope of the present disclosure is not intended to be in the above sense, but is intended to include the meaning equivalent to the claims and all modifications within the scope of the claims.

The invention claimed is:

1. An electrical connection device comprising:
   a first conductive plate provided with a cutout in a circumferential edge portion of the first conductive plate;
   a second conductive plate adjacent to the first conductive plate without contacting the first conductive plate;
   a switching element that includes a first terminal connected to the first conductive plate, a second terminal connected to the second conductive plate, and a control terminal, and that is turned on or off according to a voltage of the control terminal,
   wherein the electrical connection device further includes:
   an insulator embedded in the cutout, and
   a conductive path that is provided on the surface of the insulator and that does not contact the first conductive plate, and to which the control terminal is connected.

2. The electrical connection device according to claim 1, wherein the insulator contains metal particles.

3. The electrical connection device according to claim 1, wherein the first conductive plate and the second conductive plate are integrated by a synthetic resin having insulating properties, and
   the synthetic resin, which is provided between the first conductive plate and the second conductive plate, and the switching element face each other across a gap.

4. The electrical connection device according to claim 1, further comprising:
   a third conductive plate adjacent to the first conductive plate without contacting the first conductive plate; and
   a second switching element that includes a third terminal connected to the first conductive plate, a fourth terminal connected to the third conductive plate, and a second control terminal connected to the conductive path, and that is turned on or off according to a voltage of the second control terminal.

5. The electrical connection device according to claim 2, wherein the first conductive plate and the second conductive plate are integrated by a synthetic resin having insulating properties, and
   the synthetic resin, which is provided between the first conductive plate and the second conductive plate, and the switching element face each other across a gap.

6. The electrical connection device according to claim 2, further comprising:
   a third conductive plate adjacent to the first conductive plate without contacting the first conductive plate; and
   a second switching element that includes a third terminal connected to the first conductive plate, a fourth terminal connected to the third conductive plate, and a second control terminal connected to the conductive path, and that is turned on or off according to a voltage of the second control terminal.

7. The electrical connection device according to claim 3, further comprising:
   a third conductive plate adjacent to the first conductive plate without contacting the first conductive plate; and a second switching element that includes a third terminal connected to the first conductive plate, a fourth terminal connected to the third conductive plate, and a second control terminal connected to the conductive path, and that is turned on or off according to a voltage of the second control terminal.

8. The electrical connection device according to claim 7, wherein the insulator contains metal particles.

* * * * *